United States Patent [19]

Clements

[11] Patent Number: 4,707,814
[45] Date of Patent: Nov. 17, 1987

[54] EXTENDED CAVITY LASER RECORDING METHOD AND APPARATUS

[75] Inventor: Ken Clements, Santa Cruz, Calif.
[73] Assignee: Laser Dynamics, Inc., San Jose, Calif.
[21] Appl. No.: 711,842
[22] Filed: Mar. 14, 1985
[51] Int. Cl.$^4$ .......................... G11B 11/00; G11B 7/00
[52] U.S. Cl. ..................................... 369/13; 369/122; 360/114
[58] Field of Search ......................... 369/122, 13, 14; 360/114, 59; 372/37, 24, 50, 92

[56] References Cited

U.S. PATENT DOCUMENTS

| | | | |
|---|---|---|---|
| 3,530,259 | 9/1970 | Miller et al. | 369/122 |
| 3,582,573 | 6/1971 | Miller | 369/122 |
| 3,619,516 | 11/1971 | Miller et al. | 369/122 |
| 3,655,986 | 4/1972 | Lax | 372/24 X |
| 3,941,945 | 3/1976 | Borner et al. | 369/122 X |
| 4,059,338 | 11/1977 | Hartelius, Jr. | 369/122 X |
| 4,284,963 | 8/1981 | Allen, Jr. et al. | 372/50 |
| 4,452,533 | 6/1984 | Miles et al. | 356/352 |
| 4,460,977 | 7/1984 | Shimada et al. | 365/106 |
| 4,520,471 | 5/1985 | Carlin | 369/122 X |
| 4,564,946 | 6/1986 | Olsson et al. | 372/50 X |

FOREIGN PATENT DOCUMENTS

| | | | |
|---|---|---|---|
| 0097774 | 1/1984 | European Pat. Off. | 369/14 |
| 53-48079 | 12/1978 | Japan | 372/37 |
| 2070314 | 9/1981 | United Kingdom | 369/13 |

OTHER PUBLICATIONS

"Use Of Heterostructure Diode Lasers In Video Disk Systems", Takeda et al., Applied Optics, vol. 17, No. 6, 15 Mar. 78, pp. 863–867.
"Electro Luminescence And Semiconductor Lasers", Ivey, IEEE Journal of Quantum Electronics Nov. 1966, vol. QE-2, No. 11.
"Optical Memory Technology"; Chen; SPIE vol. 456, Optical Computing 1984, pp. 32–40.
"Optical Disk Systems Emerge"; Bartolini et al; IEEE Spectrum, Aug. 1978 pp. 20–28.
"Magneto-Optic Disk Memory"; Imamura; JARECT, vol. 10, Recent Magnetics for Electronics 1983; Sakurai (ed.) pp. 195–211.
"Magnetooptics, Lasers, and Memory Systems", Hart, IEEE Transactions Mag. Dec. 1969, pp. 700–716.
"An Extended Cavity Diode Laser Sensor"; Miles et al., Journal of Lightwave Technology, vol. LT-1, No. 1, Mar. 1983, pp. 81–92.

*Primary Examiner*—Aristotelis M. Psitos
*Attorney, Agent, or Firm*—Fliesler, Dubb, Meyer & Lovejoy

[57] ABSTRACT

An apparatus for recording data on a recording medium using an extended cavity laser in which the recording medium is an integral part of the laser cavity. The recording medium may be magnetic or nonmagnetic.

22 Claims, 5 Drawing Figures ated by the coil 109 is then used for inducing a magnetic
EXTENDED CAVITY LASER RECORDING METHOD AND APPARATUS

BACKGROUND OF THE INVENTION

1. Field of the Invention

The present invention relates to a method and apparatus for recording data on a medium in general and to a method and apparatus comprising a laser having an extended cavity which includes the medium for recording data on the medium in particular.

2. Description of the Prior Art

Lasers have been used for recording data on magnetic as well as on nonmagnetic or optic recording mediums.

Currently, apparatus comprising lasers for recording data on a magnetic recording medium is known as a magnetooptic recording apparatus. To record data on a magnetic medium, such apparatus uses what is called the thermomagnetic writing effect.

Referring to FIG. 1 of the accompanying drawing, there is provided a block diagram of a typical prior known magnetooptic recording apparatus. In this apparatus, laser light is generated by a laser 101, collimated by a lens 102 and focused by a lens 103 on a magnetic recording surface 106 of a disk 105 which is rotatable about an axis 108. An apparatus represented by crossed arrows 104 is provided for moving the lens 103 to keep the light focused at the surface 106, as well as to allow the focus point to be moved small increments in the radial direction of the disk. A means of inducing a magnetic field in the region of the focus point is provided by a coil 109. The disk 105 may also be provided with a transparent overcoat 107 to protect the surface 106.

In operation, the laser light focused on the surface 106 lowers the coercivity of a region of the underlying magnetic material. A polarized magnetic field generated by the coil 109 is then used for inducing a magnetic domain in the region. Logical ones and zeros are thus stored depending on the polarity of the magnetic field.

Because the magnetic medium is not an integral part of the laser optical cavity, a principal disadvantage of the prior known laser magnetooptic recording apparatus is the requirement for a lens system and focus control. The lens system and focus control are disadvantageous because they are typically expensive and require a great deal of space in the apparatus. The lens system, in particular, is disadvantageous due to problems associated with diffraction and other optical phenomena and the consequent restriction on the amount of energy that can be concentrated within a given area of the surface of the recording medium as a result thereof.

An apparatus in which an external reflective member is an integral part or component of the laser optical cavity has been disclosed by R. O. Miles, A. Dandridge, A. B. Tveten and T. G. Giallorenti in their article "An External Cavity Diode Laser Sensor", which appeared in the *Journal of Lightwave Technology*, Vol. LT-1, No. 1, March 1983. In this apparatus, forming a semiconductor laser sensor, a front facet of a diode laser is arranged to be held within a few wave lengths of a reflective member. As the reflective member is perturbed, even slightly, the phase of the light reflected back into the laser cavity is altered thus varying the effective laser facet reflectivity. The change in laser output is detected as a measure of the distance the reflective member moves relative to the exit facet of the laser.

While the article describes an external or extended cavity laser in which a reflective member is an integral part of the laser cavity, the description is restricted to an apparatus responsive to phase changes in reflected light in the optical cavity. There is no disclosure or suggestion of any use of such a laser for recording on a recording medium of any kind.

Prior known apparatus used for optic disk writing is similar to the apparatus described above for magnetooptic writing, except that the recording medium is typically nonmagnetic and consequently the coil 109 is not needed.

In the operation of optic disk writing apparatus comprising a laser, the focused output of the laser is used to heat a spot on the disk surface until some change of state on the surface of or in a layer on the disk occurs. This change may comprise the melting, pitting or blistering of the layer or the facilitating of a chemical reaction or phase change in the layer. In any case, the resolution of prior known optic disk writing apparatus which uses a lens system, as in the case of prior known magnetooptic recording apparatus, is limited by the capability of the lens system to focus the light down to a very small spot, and to keep the focal plane at the surface.

SUMMARY OF THE INVENTION

In view of the foregoing, principal objects of the present invention are a method and apparatus for recording data on magnetic or a nonmagnetic recording medium comprising an extended or external cavity laser in which the medium is maintained within or intercepts a standing wave generated by the laser and thus is an integral part of the laser cavity. Information is recorded on the medium by selectively altering the surface of or a layer in the medium.

In one embodiment of the present invention, a magnetic medium is recorded using the thermomagnetic effect. In this embodiment, the medium is maintained within the standing wave of a semiconductor laser at or within a few wavelengths of the exit facet of the laser. A coil is provided at the exit facet of the laser for providing a magnetic field having its poles aligned with the optical cavity of the laser and perpendicular to the surface of the medium.

In operation, the energy of the light from the exit facet of the laser is applied to a selected region of the magnetic material on the disk reducing the magnetic coercivity of the magnetic material in the region. Thereafter, the application of a magnetic field generated by the coil to the region induces a magnetic domain in the region which has poles aligned perpendicular to the surface of the material.

In another embodiment of the present invention, the magnetic medium is maintained within the standing wave of the laser at or within a few wavelengths of the exit face of a light guide, such as an optic fiber. The entrance face of the light guide is closely coupled to the exit facet of the laser. A coil is provided at the exit face of the light guide for providing a magnetic field having its poles aligned with the axis of the light guide and perpendicular to the surface of the medium.

In operation, the recording of data on the magnetic medium in the latter embodiment using a light guide is done in the same manner as described above with respect to the previous embodiment.

In another embodiment of the present invention, a nonmagnetic medium is maintained within the standing wave of a laser at or within a few wavelengths of an exit facet of the laser or at or with a few wavelengths of the exit face of a light guide as described above with respect to the two previous embodiments. The principal difference between this embodiment and the previous embodiments is that, since a nonmagnetic medium is used, the coil in the previous embodiments is not required.

In the operation of the latter embodiment, energy from the laser is used for melting, pitting, blistering or otherwise changing the physical character of the surface of the medium or for facilitating a chemical reaction or phase change in a layer of the medium. The type of alteration of the medium, of course, depends on the material of the medium and its reaction to the energy provided by the laser, all of which is well known.

In still another embodiment of the present invention, all of the components of the apparatus are the same as in the previous embodiments except that a tunable cleaved coupled cavity laser is used for generating a plurality of standing waves of stimulated emissions and the materials used in the recording medium are separately responsive to each of said standing waves.

In the operation of this embodiment, each of the standing waves is used for producing a predetermined alteration in the materials of the recording medium which is responsive thereto such that a plurality of bits of data may be stored at a single location on the medium. For example, with a recording medium comprising a first material which is only responsive to a standing wave comprising a first frequency and a second material which is only responsive to a standing wave comprising a second frequency, four bits of information may be stored at a single location of the medium by selectively generatng one or both of said standing waves. The various types of materials that can be used and their response to laser radiation are well known.

In general, the principal advantages of each of the above described embodiments are that, by avoiding the use of a lens system and a focus control, the limitations associated with diffraction and other optical phenomena are avoided, less energy is required for recording data on a medium and higher bit densities are obtainable. Moreover, by using an array of the embodiments described, multiple tracks on a recording medium can be recorded simultaneously.

BRIEF DESCRIPTION OF THE DRAWING OF EMBODIMENTS OF THE PRESENT INVENTION

The above and other objects, features and advantages of the present invention will become apparent from the following detailed description of the accompanying drawing in which.

DETAILED DESCRIPTION OF THE INVENTION

Figure 1:
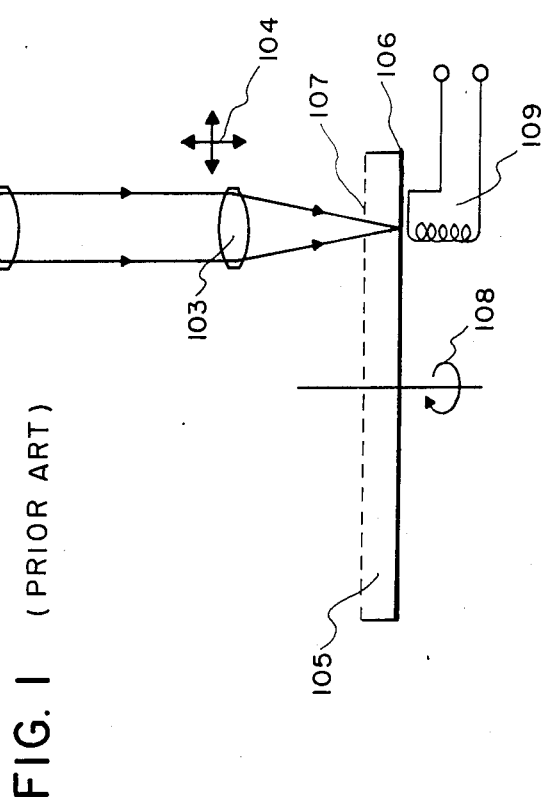
FIG. 1 is a block diagram of a typical prior known magnetooptic recording apparatus.
Figure 2:
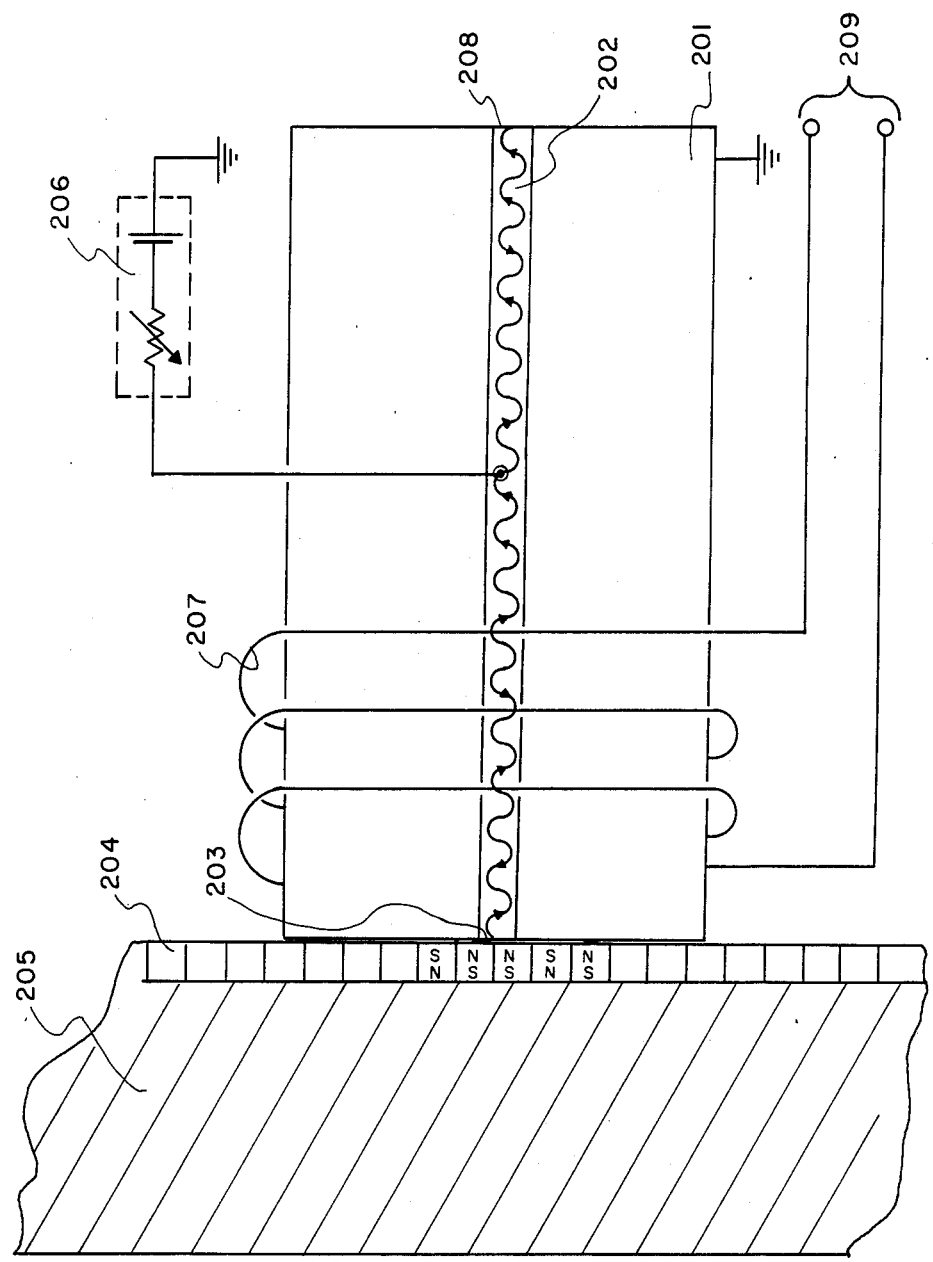
FIG. 2 is a block diagram of a laser recording apparatus according to the present invention.

Referring to FIG. 2, there is provided in accordance with the present invention a semiconductor laser diode 201. Diode 201 is provided with an active region (optical cavity) 202 for supporting a standing wave (shown by arrows), a front facet 203 and a rear facet 208. The facets 203 and 208 of the laser 201 comprise a generally rectangular cross-section having a long axis and a short axis. Maintained within the standing wave of the laser at or within a few wavelengths of the exit facet 203, there is provided a magnetic layer 204 that is supported by a substrate 205. Or, in other words, both the diode 201 and the reflective magnetic layer 204 must be present to generate a standing wave which extends through the active region of the diode to the surface of the recording medium. An adjustable current source 206 is provided to supply injection current to the laser. A coiled conductor 207, having a pair of terminals 209, is wrapped around the laser at the exit facet 203 so as to provide a magnetic field centered around the optical axis of the laser which may be oriented by the polarity of current applied to the terminals 209.

In a preferred embodiment of the invention, the substrate 205 is an aluminum or plastic disk with the magnetic surface 204 thereon fabricated by coating, plating, sputtering or other means. The laser is oriented such that its optical cavity is perpendicular to the surface of the disk, with the long axis of the cross-section of active layer oriented radially. Therefore, the narrow dimension or short axis of the cross-section of the front facet 203 gives the maximum resolution linearly in the track.

Figure 3:
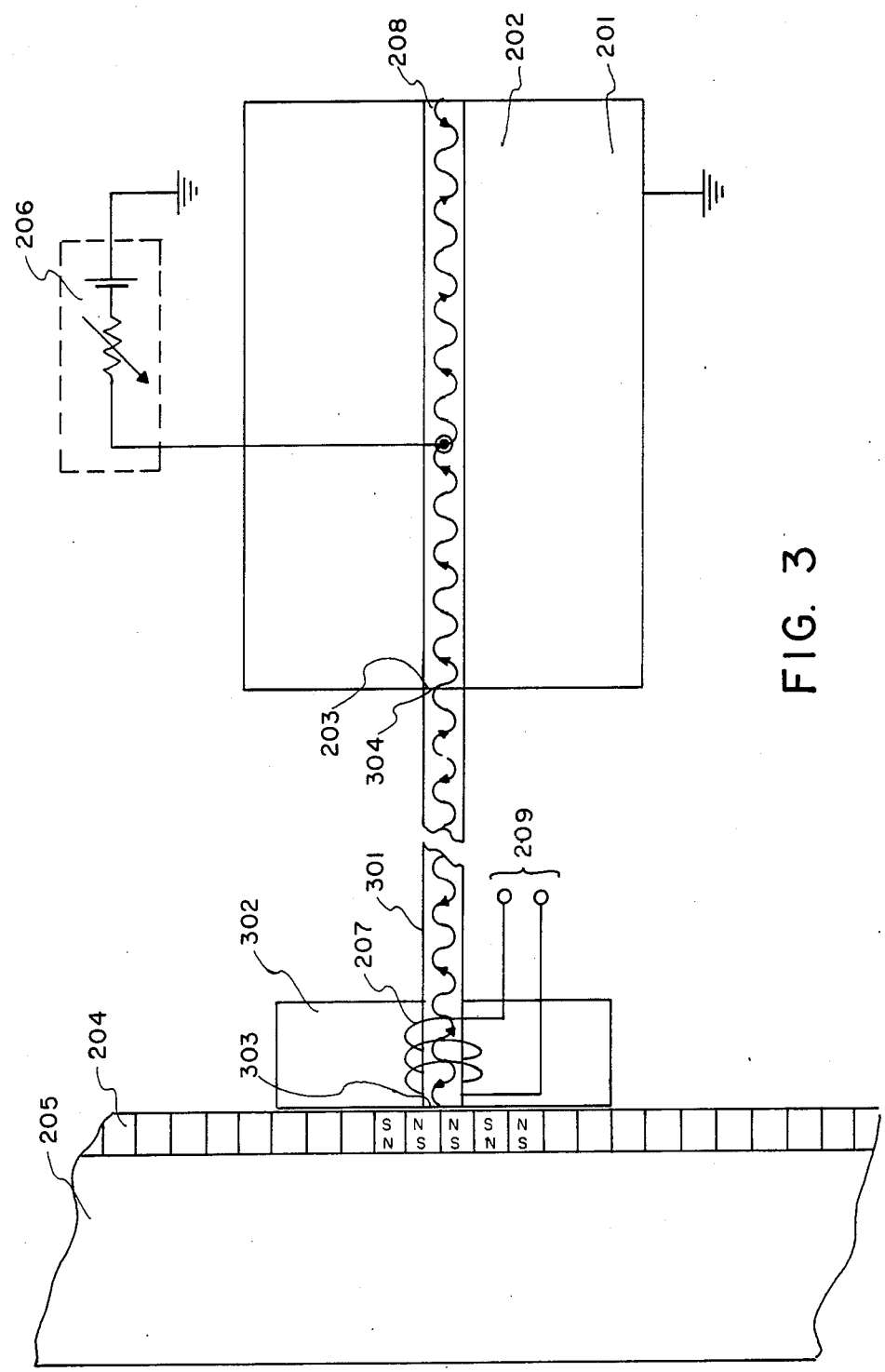
FIG. 3 is a block diagram of another embodiment of the present invention in which an extension of the optical cavity of a laser is provided by means of a light guide or optic fiber.

Referring to FIG. 3, there is provided in an apparatus as described above, a light guide or optic fiber 301 having an exit face 303 and an entrance face 304. The guide 301 is added to the apparatus of FIG. 2 in order to allow the laser 201 to be mounted away from the layer 204 of the disk 205. Whereas the end 304 of the light guide 301 is coupled directly to the exit facet 203 of the laser diode 201, the other end 303 is positioned very close to, e.g. within a few wavelengths, or against the magnetic surface 204 by a physical holding and positioning means 302.

In the operation of the embodiments of FIGS. 2 and 3, the surface 204 of the recording medium effectively becomes a part of the cavity of the semiconductor laser 201 and the interaction of the light from the laser 201 with the surface 204 can take many forms. For example, the atoms of the surface and in the underlying region of the material may be optically pumped to the point of stimulated emissions, or they may just act to absorb and/or reflect the laser light. In each case, thermal energy is transferred to the surface 204 which, due to the thermomagnetic effect, will change the magnetic coercivity of the material in the region of the transfer. When the magnetic coercivity in the region of the transfer is reduced, information is written on the magnetic surface by applying a current to the coil 207.

As is common with prior known thermomagnetic recording apparatus, either the laser 201 may be modulated by means of its current supply 206 while the magnetic field generated by the coil 207 is held constant, or the output of the laser 201 may be held constant and the magnetic field modulated to record on the surface 204. Of course, if the field is held constant and the laser is modulated, all bits recorded will be of one magnetic orientation.

Figure 4:
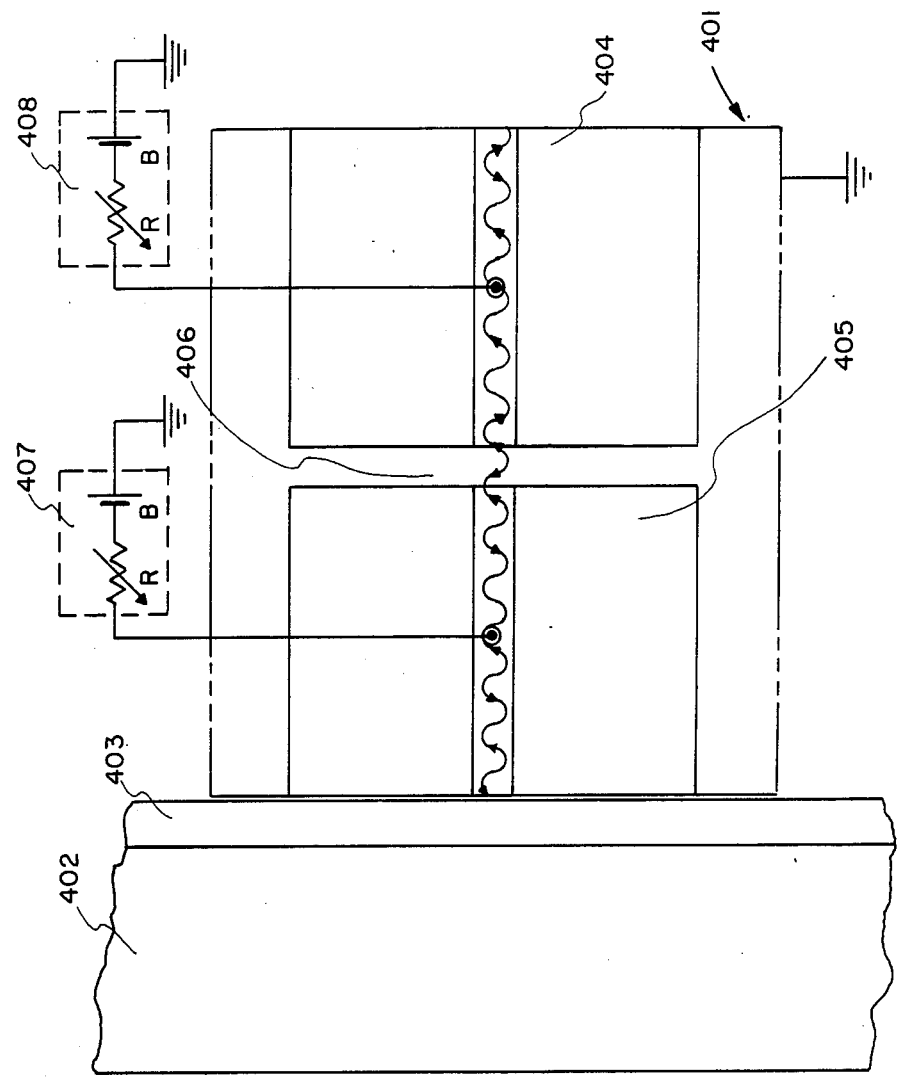
FIG. 4 is a block diagram of another embodiment of the present invention comprising a cleaved coupled cavity laser for providing a spectral line selection capability.

Referring to FIG. 4, there is provided in another embodiment of the present invention in place of the diode 201 and disk 205 of FIGS. 2 and 3, a conventional tunable cleaved coupled cavity laser 401 for selectively generating one at a time a plurality of standing waves, each having a unique wavelength, and a nonmagnetic recording disk 402 comprising a layer 403.

The laser 401 comprises a plurality of diode sections 404 and 405 separated by a gap 406 and coupled to a pair of controllable injection current bias circuits 407 and 408, respectively.

The layer 403 comprises a plurality of materials, each of which is responsive to one of the plurality of standing waves generated by the laser 401.

In operation, each of the materials in the layer 403 changes state in response to one of the plurality of standing waves in a conventional and well-known manner such that a plurality of bits of information can be stored at a single location in the material 403 on the disk 402. For example, stimulated emissions may be induced in a first one of said materials in response to a standing wave having a first wavelength and in a second one of said materials in response to a standing wave having a second wavelength.

Figure 5:
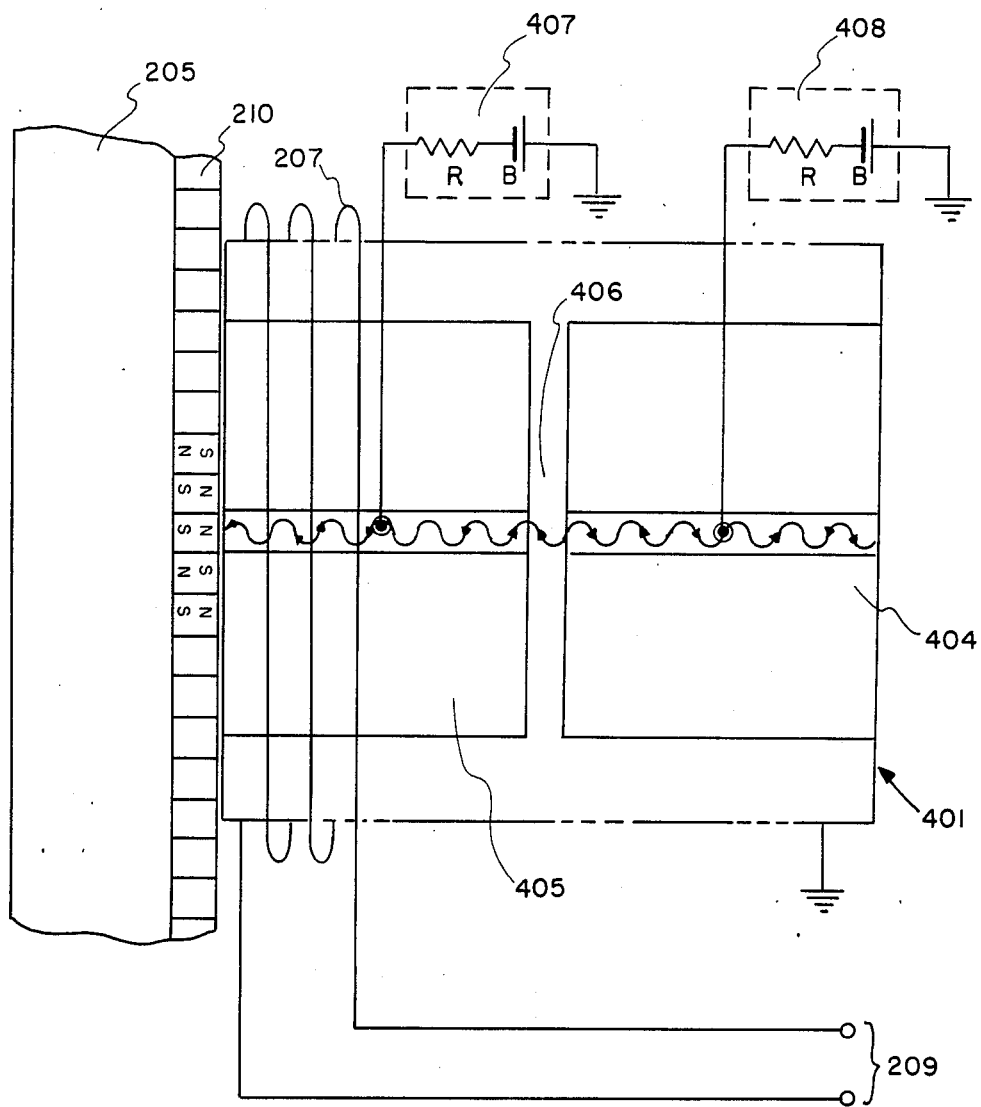
FIG. 5 is a block diagram of another embodiment of the present invention comprising a cleaved coupled cavity laser for providing a spectral line selection capability with a magnetic recording media.

Referring to FIG. 5, in another embodiment of the present invention the laser diode 201 in the apparatus of FIG. 2 is replaced by the tunable cleaved coupled cavity laser 401 of FIG. 4. In addition, the magnetic layer 204 on the surface of the disk 205 which is responsive to monochromatic radiation, as described above with respect to FIG. 2, is replaced by a magnetic layer 210 which comprises a plurality of materials, each of which is responsive to one of the plurality of standing waves generated by the laser 401.

In operation, each of the materials in the layer 210 changes state in response to one of the plurality of standing waves in a conventional and well known manner such that a plurality of bits of information can be stored at a single location in the material 210 on the disk 205. For example, magnetic domains may be induced in a first one of said materials in response to a standing wave having a first wavelength and in a second one of said materials in response to a standing wave having a second wavelength.

While the invention has been particularly shown and described with reference to several embodiments thereof, it will be understood by those of skill in the art that various changes in form and details may be made thereto without departing from the spirit and scope of the invention as defined in the claims hereinafter provided.

What is claimed is:

1. A method of recording data on a magnetic medium comprising the steps of:
   providing a laser means having an active region for producing stimulated emissions of radiation and a magnetic medium which is essential to produce a standing wave of said radiation which extends through said active region to the surface of said magnetic medium, said magnetic medium having a coercivity which is reduced when said material is irradiated with said radiation;
   irradiating regions of said magnetic medium with said radiation to reduce the magnetic coercivity of said magnetic medium in said regions; and
   applying a magnetic field to said regions, said magnetic field and said radiation co-acting to induce a predetermined magnetic domain in each of said regions.

2. A method according to claim 1 wherein said irradiating step comprises the step of modulating the amplitude of said radiation while said magnetic field comprises a constant magnitude.

3. A method according to claim 1 wherein said magnetic field applying step comprises the step of modulating the magnitude of said magnetic field while said radiation comprises a constant amplitude.

4. A method according to claim 1 wherein said irradiating step comprises the step of propagating said standing wave through a light guide.

5. A method according to claim 1, wherein said irradiating step comprises the step of propagating said standing wave through an optic fiber.

6. A method according to claim 1 wherein said irradiating step comprises the step of irradiating said surface with said radiation in said standing wave while said surface is moved in a direction perpendicular to said standing wave.

7. A method of recording data on a magnetic medium comprising:
   providing a laser means having an active region for producing stimulated emissions of radiation and a magnetic medium which is essential to produce a standing wave of said radiation which extends through said active region to the surface of said magnetic medium;
   selectively changing the wavelength of said standing wave so as to provide a plurality of standing waves having unique wavelengths;
   providing a plurality of magnetic materials in said magnetic medium, each of said materials having a magnetic coercivity which is reduced when said material is irradiated with radiation having a predetermined one of said unique wavelengths;
   irradiating regions of said materials with selected wavelengths of said radiation to reduce the magnetic coercivity of the material responsive to said wavelengths in each of said regions;
   applying a magnetic field to said regions, said magnetic field and said radiation co-acting to induce a predetermined magnetic domain in the material in each of said regions which is responsive to the wavelength of the radiation incident thereon.

8. A method according to claim 7 wherein said irradiating step comprises the step of modulating the amplitude of said radiation while said magnetic field comprises a constant magnitude.

9. A method according to claim 7 wherein said magnetic field applying step comprises the step of for modulating the magnitude of said magnetic field while said radiation comprises a constant amplitude.

10. A method according to claim 7 wherein said laser means comprises a tunable cleaved coupled cavity laser.

11. An extended cavity laser recording apparatus for recording data on a magnetic medium comprising:
    a laser means having an active region for producing stimulated emissions of radiation and a magnetic medium which is essential to produce a standing wave of said radiation which extends through said active region to the surface of said magnetic medium, said magnetic medium having a coercivity which is reduced when said material is irradiated with said radiation;
    means for irradiating regions of said magnetic medium with said radiation to reduce the magnetic coercivity of said magnetic medium in said selected regions; and means for applying a magnetic field to said regions, said magnetic field and said radiation co-acting to induce a predetermined magnetic domain in each of said regions.

12. An apparatus according to claim 11 wherein said irradiating means comprises means for modulating the amplitude of said radiation while said magnetic field comprises a constant magnitude.

13. An apparatus according to claim 11 wherein said magnetic field applying means comprises means for modulating the magnitude of said magnetic field while said radiation comprises a constant amplitude.

14. An apparatus according to claim 11 wherein said irradiating means comprises means for propagating said standing wave through a light guide.

15. An apparatus according to claim 11 wherein said irradiating means comprises means for propagating said standing wave through an optic fiber.

16. An apparatus according to claim 11 wherein said active region comprises a longitudinal axis and a generally rectangular cross-section and said irradiating means comprises means for propagating said standing wave from said cavity to said surface in a direction perpendicular to said surface.

17. An apparatus according to claim 16 wherein said propagating means comprises means for propagating said standing wave to said surface while said surface is moved in a direction perpendicular to the long axis of said cross-section of said optical cavity.

18. An extended cavity laser recording apparatus for recording data on a magnetic medium comprising:

a laser means having an active region for producing stimulated emissions of radiation and a magnetic medium which is essential to produce a standing wave of said radiation which extends through said active region to the surface of said magnetic medium;

means for selectively changing the wavelength of said standing wave so as to provide a plurality of standing waves having unique wavelengths;

a plurality of magnetic materials in said magnetic medium, each of said materials having a magnetic coercivity which is reduced when said material is irradiated with radiation having a predetermined one of said unique wavelengths;

means for irradiating regions of said materials with selected wavelengths of said radiation to reduce the magnetic coercivity of the material responsive to said wavelengths in each of said regions;

means for applying a magnetic field to said regions, said magnetic field and said radiation co-acting to induce a predetermined magnetic domain in the material in each of said regions which is responsive to the wavelength of said radiation incident thereon.

19. An apparatus according to claim 18 wherein said irradiating means comprises means for modulating the amplitude of said radiation while said magnetic field comprises a constant magnitude.

20. An apparatus according to claim 18 wherein said magnetic field applying means comprises means for modulating the magnitude of said magnetic field while said radiation comprises a constant amplitude.

21. An apparatus according to claim 18 wherein said wavelength changing means comprises a tunable cleaved coupled cavity laser.

22. A method of recording data on a recording medium comprising:

providing a laser means having an active region for producing stimulated emissions of radiation and a recording medium which is essential to produce a standing wave of said radiation which extends through said active region to the surface of said recording medium;

selectively changing the wavelength of said standing wave so as to provide a plurality of standing waves having unique wavelengths; and providing a plurality of materials in said recording medium, each of said materials having a predetermined response to a different one of said plurality of standing waves.

* * * * *